United States Patent
Hanjani

[11] Patent Number: 6,157,265
[45] Date of Patent: Dec. 5, 2000

[54] PROGRAMMABLE MULTI-SCHEME CLOCKING CIRCUIT

[75] Inventor: Hassan Hanjani, Fremont, Calif.

[73] Assignee: Fairchild Semiconductor Corporation, South Portland, Me.

[21] Appl. No.: 09/298,686

[22] Filed: Apr. 23, 1999

Related U.S. Application Data

[60] Provisional application No. 60/106,477, Oct. 30, 1998.

[51] Int. Cl.[7] .............................. H03B 5/00; H03B 5/20; H03B 5/30; H03B 28/00
[52] U.S. Cl. ...................... 331/49; 331/74; 331/108 D; 331/143; 331/158; 331/173; 327/298
[58] Field of Search ................................ 331/46, 49, 60, 331/74, 108 D, 111, 143, 158, 173; 327/295–298

[56] References Cited

U.S. PATENT DOCUMENTS

| | | |
|---|---|---|
| 4,816,776 | 3/1989 | Kessler ...................................... 331/49 |
| 5,036,300 | 7/1991 | Nicolai ..................................... 331/143 |
| 5,122,677 | 6/1992 | Sato ........................................ 307/269 |
| 5,126,695 | 6/1992 | Abe .......................................... 331/46 |
| 5,180,991 | 1/1993 | Takashima .............................. 331/1 A |
| 5,196,810 | 3/1993 | Graether et al. .......................... 331/49 |
| 5,369,377 | 11/1994 | Benhamida ................................ 331/49 |
| 5,414,308 | 5/1995 | Lee et al. ................................. 327/293 |
| 5,467,028 | 11/1995 | Yoshida et al. ............................ 326/38 |
| 5,623,234 | 4/1997 | Shaik et al. ................................ 331/49 |
| 5,666,522 | 9/1997 | Klein ....................................... 395/556 |
| 5,684,434 | 11/1997 | Mann et al. ............................... 331/16 |
| 5,699,024 | 12/1997 | Manlove et al. ......................... 331/111 |
| 5,754,081 | 5/1998 | Kuroiwa et al. ........................... 331/49 |
| 5,790,609 | 8/1998 | Swoboda ................................. 375/357 |
| 5,982,241 | 11/1999 | Nguyen et al. ............................ 331/49 |

*Primary Examiner*—David Mis
*Attorney, Agent, or Firm*—Philip H. Albert; Townsend and Townsend and Crew LLP

[57] ABSTRACT

A programmable multi-scheme clocking circuit supports multiple applications. In one implementation, the clocking circuit includes multiple clock sources such as a crystal oscillator, a RC oscillator, an internal oscillator, and an external clock. Each of the clock sources can be enabled by a respective control signal. A multiplexer couples to the clock sources and provides a clock signal from one of the clock sources as the output clock signal. External support circuitry (e.g., external tank circuits) for some of the clock sources (e.g., the crystal oscillator and the RC oscillator) can be coupled to the clocking circuit through one or more device pins. The pins to support the crystal oscillator, the RC oscillator, and the external clock signal are shared so that no additional device pins are required.

7 Claims, 5 Drawing Sheets

PROGRAMMABLE MULTI-SCHEME CLOCKING CIRCUIT

This application claims priority from U.S. Provisional Application Serial No. 60/106,477, filed Oct. 30, 1998, and incorporated herein by reference.

BACKGROUND OF THE INVENTION

The present invention relates generally to digital logic circuits, and in particular to a programmable multi-scheme clocking circuit.

Circuits that generate clock signals are prevalent in the electronics art. For many digital circuits, clock signals are necessary to drive various logic elements such as gates, flip-flops, and so on. Clock signals are also used in many other circuits for applications such as modulation, demodulation, and others.

Each application generally has a particular set of specifications for the required clock signal(s). For example, in many applications (e.g., modulation and demodulation), high frequency accuracy and low frequency drift are required. These characteristics can be provided by a crystal oscillator. The frequency of a crystal oscillator is typically accurate to within tens of part per million (ppm) and very stable over temperature and time. For applications whereby moderate frequency accuracy is required, an oscillator using a simple resistor/capacitor (RC) network may be adequate. Generally, a RC oscillator can provide frequency accuracy to within several percents. In some applications, low cost and/or small board space may be the most important considerations, and an internal oscillator is preferred. Finally, some applications require the digital circuits to be operable from an external clock. This may be necessitated, for example, by the need to synchronize various circuits.

Generally, an integrated circuit is designed and targeted for use in one or more specific applications. The clock requirements of the targeted application(s) then determine the clock circuit to be included in the integrated circuit. Based on the clock requirements, a crystal oscillator circuit, a RC oscillator circuit, an internal oscillator circuit, or an external clock buffer can be designed into the integrated circuit. Conventionally, once the design choice has been made for that integrated circuit, its use is generally limited to the specific applications for which it is targeted.

Many integrated circuits perform specialized functions and are suitable for specific applications. However, some general-purpose integrated circuits, such as controllers, find use in a variety of applications. Oftentimes, new applications are discovered for these general-purpose circuits after they have been designed. For these reasons, it is advantageous to provide integrated circuits having flexible and selectable clocking schemes.

SUMMARY OF THE INVENTION

The invention provides a programmable multi-scheme clocking circuit that supports multiple applications. In one implementation, the clocking circuit includes (or supports) multiple clock sources such as a crystal oscillator, a RC oscillator, an internal oscillator, and an external clock. Each of the clock sources can be enabled by a respective control signal. A multiplexer or a "selection circuit" couples to the clock sources and provides a clock signal from one of the clock sources as the output clock signal. External support circuitry (e.g., external tank circuits) for some of the clock sources (e.g., the crystal oscillator and the RC oscillator) can be coupled to the clocking circuit through one or more external device pins of an integrated circuit.

The invention provides these various clock capabilities with a minimum number of device pins. In one embodiment, the pins to support the crystal oscillator, the RC oscillator, and the external clock signal are shared. Within the integrated circuit, the pins are coupled to the proper clock source through a set of switches.

A specific embodiment of the invention provides a clocking circuit that includes multiple clock sources and a multiplexer. Each of the clock sources provides a respective clock signal. The multiplexer couples to the clock sources, receives a set of control signals, and provides one of the clock signals from the clock sources as an output clock signal. Additionally, a control circuit can be included with the clocking circuit. The control circuit couples to the plurality of clock sources and the multiplexer, selectively enables one or more clock sources, and provides the set of control signals to the multiplexer.

Another specific embodiment of the invention provides a programmable multi-scheme clocking circuit that is implemented within an integrated circuit. The clocking circuit includes multiple clock sources, a multiplexer, and a control circuit. The clock sources couple to at least one device pin of the integrated circuit. Each clock source provides a clock signal having predetermined characteristics. The multiplexer couples to the clock sources, receives a set of control signals, and provides one of the clock signals from the clock sources as the output clock signal. The control circuit couples to the clock sources and the multiplexer. The control circuit selectively enables one or more clock sources and provides the multiplexer with the set of control signals.

Yet another specific embodiment of the invention provides a programmable oscillator implemented within an integrated circuit. The programmable oscillator includes one or more active devices coupled to one or more programmable current-capacitor (I-C) circuits. The active device(s) provides signal gain. Each programmable I-C circuit includes a programmable current source operatively coupled to a capacitor. The programmable current source can be implemented with a set of fixed current sources, each providing a predetermined amount of current.

Yet another specific embodiment of the invention provides a programmable oscillator implemented within an integrated circuit. The programmable oscillator includes two cross-coupled logic gates coupled to two respective programmable current-capacitor (I-C) circuits. Each programmable I-C circuit includes a programmable current source, a capacitor, and a switch. The programmable current source be implemented with a set of fixed current sources, each providing a predetermined amount of current. The capacitor operatively couples to the programmable current source and to the switch. A pair of amplifiers can be provided, with each amplifier coupled between a respective logic gate and programmable I-C circuit.

The foregoing, together with other aspects of this invention, will become more apparent when referring to the following specification, claims, and accompanying drawings.

DESCRIPTION OF THE SPECIFIC EMBODIMENTS

Circuit Overview

Figure 1:
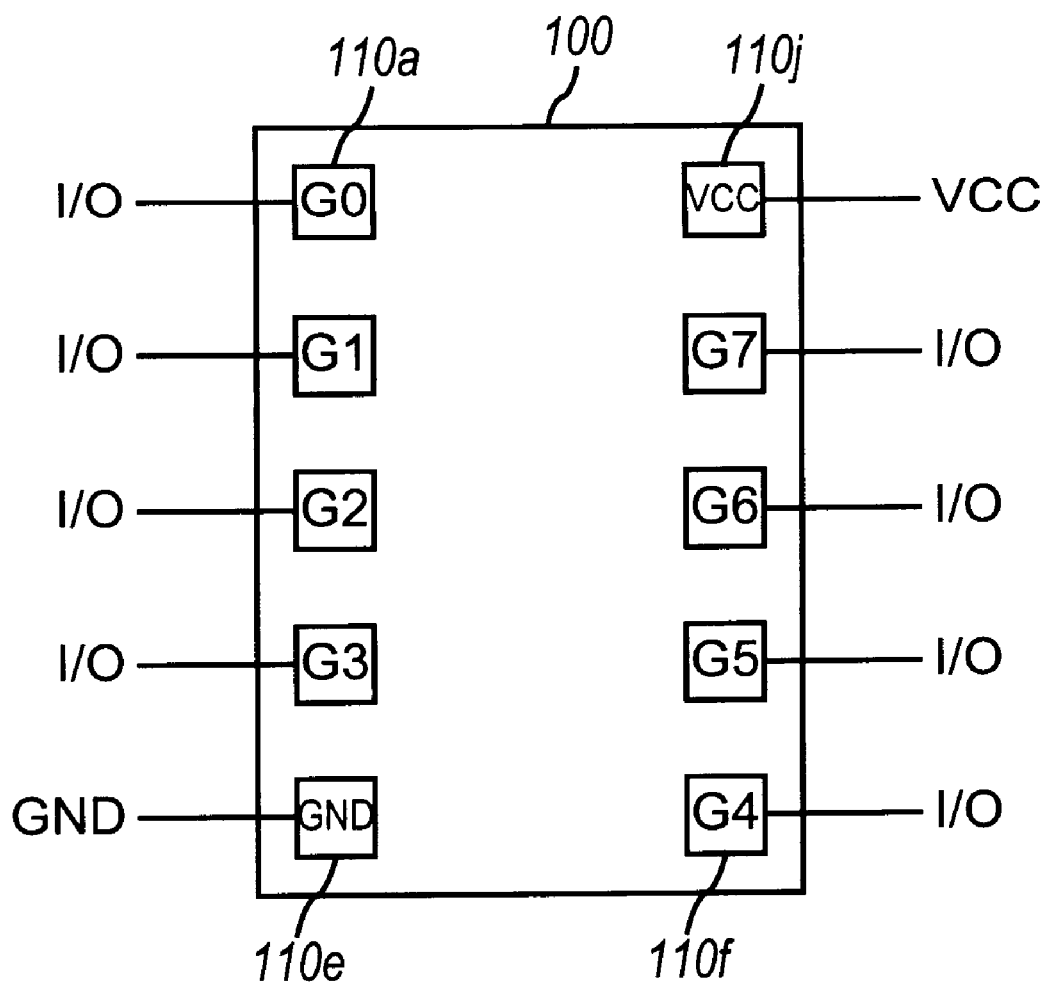
FIG. 1 is a diagram of an integrated circuit including a plurality of pins.

FIG. 1 is a diagram of an integrated circuit 100 including a plurality of external device pins 110. Integrated circuit 100 can be a controller, a processor, a microprocessor, a digital signal processor, a memory device, or other electronic circuits. As a memory device, integrated circuit 100 can be a random access memory (RAM), a read only memory (ROM), an erasable programmable read only memory (EPROM), an electronically erasable programmable read only memory (EEPROM), or a FLASH EPROM. As shown in FIG. 1, integrated circuit 100 includes, for example, ten pins. The number of pins on an integrated circuit is usually dictated by the required finctionality, cost, and other considerations. Some of pins 110, such as pins 110e and 110j, are reserved for ground and power supply, respectively. The remaining pins are each generally available for use as an input pin, an output pin, or an input/output (I/O) pin. In a specific embodiment, integrated circuit 100 is a controller that provides interface functions for devices such as a mouse, a trackball, a joystick, a glide pad, and others devices, or a combination of these devices.

Programmable Multi-Scheme Clocking Circuit

Figure 2:
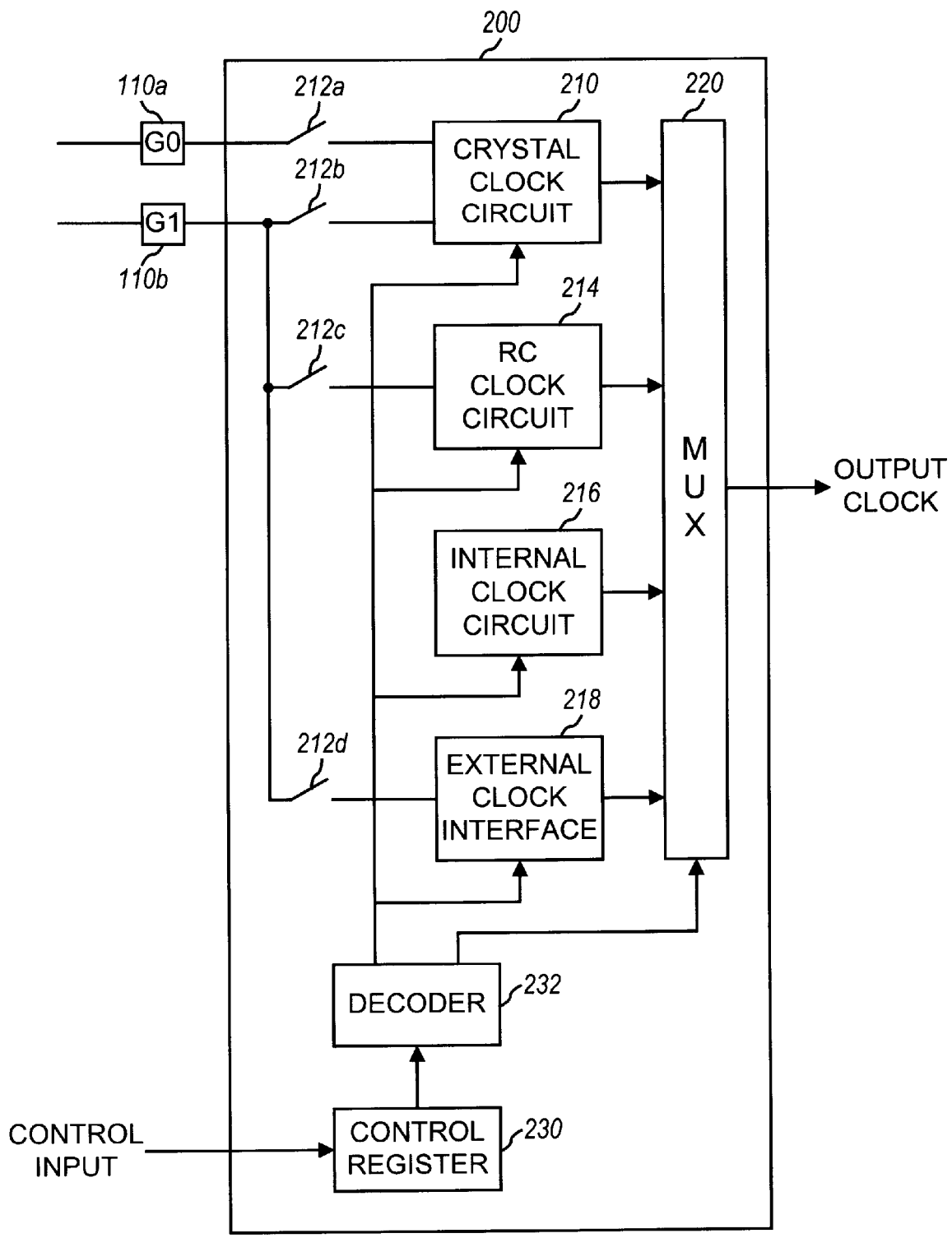
FIG. 2 is a block diagram of a programmable multi-scheme clocking circuit.

FIG. 2 is a block diagram of a programmable multi-scheme clocking circuit 200 that resides within integrated circuit 100. The embodiment shown in FIG. 2 includes four different clock sources: (1) a crystal oscillator, (2) a RC oscillator, (3) an internal oscillator, and (4) an external clock. A crystal oscillator circuit 210 supports the crystal oscillator and operatively couples to pins 110a and 110b through a pair of switches 212a and 212b, respectively. A RC clock circuit 214 supports the RC oscillator and operatively couples to pin 110b through a switch 212c. An internal oscillator 216 provides an internal clock signal, when enabled. An external clock interface 218 receives and buffers an external clock signal and operatively couples to pin 110b through a switch 212d. Crystal clock circuit 210, RC clock circuit 214, internal oscillator 216, and external clock interface 218 are generically referred to as clock sources. The clock sources couple to a multiplexer (MUX) 220 that provides a clock signal from one of the clock sources as an output clock signal.

A control register 230 enables selected ones of the clock sources, and further selects one of the enabled clock signals as the output clock signal. In one embodiment, control register 230 includes non-volatile memory elements (e.g., EEPROM or FLASH memory elements) that store control data as to which clock sources to enable and which clock signal to select as the output clock signal. The non-volatile memory elements retain the control data when integrated circuit 100 is powered off so that the data is available upon power up. With this design, integrated circuit 100 does not need to be reprogrammed upon each power up.

For the embodiment shown in FIG. 2, two bits of storage are used to enable and select one of four clock sources. More bits are used for more complex clocking schemes. The control data can be provided to control register 230, through a control input as shown in FIG. 2, by a source external or internal to integrated circuit 100. For example, the control data can come from a controller (i.e., on the same circuit board) or a tester circuit (i.e., during the manufacturing/testing phase) external to integrated circuit 100 through one of pins 110. Alternatively, the control data can come from a controller within integrated circuit 100.

The control data from control register 230 is provided to a decoder 232 that decodes the data and provides the appropriate control signals to the clock sources, switches 212 (not shown in FIG. 2), and MUX 220. In the embodiment shown in FIG. 2, a separate control signal is provided to each of the clock sources to allow the clock sources to be individually enabled. Another set of control signals is provided to MUX 220 to select one of the enabled clock signals as the output clock signal.

Decoder 232 can be implemented with combinatorial logic, sequential logic, a look-up table, or other circuits. Collectively, control register 230 and decoder 232 are referred to as a control circuit.

In one embodiment, the control signals for the clock sources, switches, and MUX are provided directly from an external source or other circuits within integrated circuit 100. In this embodiment, control register 230 and decoder 232 are not required.

In one embodiment, only one clock source is enabled and selected at any given time. Disabling the unused clock sources reduces power consumption and minimizes circuit noise. In another embodiment, multiple clock sources are enabled simultaneously to support multiple functions. In this embodiment, multiple MUXes can be used, one MUX for each required output clock signal. In yet another embodiment, the clock sources can be dynamically enabled and disabled (i.e., in accordance with the control data in control register 230). As an example, external clock interface 218 can be selected for use during an initial warm up period upon power up, while waiting for internal oscillator 216 to settle. Once internal oscillator 216 has settled, external clock interface 218 is disabled and internal oscillator 216 is selected for use. As another example, internal oscillator 216 can be selected for use to initialize integrated circuit 100. After initialization, the proper clock source can be selected for use.

As shown in FIG. 2, clocking circuit 200 includes four clock sources. However, the invention can be modified to include greater or fewer number of clock sources. For example, clocking circuit 200 can be designed to receive two external clock signals concurrently. As another example, RC clock circuit 214 can be omitted from clocking circuit 200. Other circuit configurations can be designed and are within the scope of the invention.

As shown in FIG. 2, two pins are used to support the crystal oscillator. Some crystal oscillator designs require only one pin (e.g., a negative resistance oscillator). The invention is equally applicable to these various oscillator designs.

Programmable multi-scheme clocking circuit 200 provides many advantages over conventional clocking circuits. First, clocking circuit 200 can support applications that have different sets of clock requirements. Conventionally, a circuit designed for a particular application is typically excluded for use in other applications if the clock requirements are sufficiently different from the initial design specifications. With the invention, appropriate clock characteristics can be obtained by simply programming clocking circuit 200 to operate in the desired mode (and possibly including few additional external components).

Second, the invention provides these advantages without requiring additional pins. As shown in FIG. 2, at most two pins are required to support four clock sources. The unused pin(s) can be allocated for other use. This feature is especially advantageous for low cost integrated circuits where low pin count and low cost are important considerations.

Third, internal oscillator 216 provides flexible clocking schemes, and can be used in combination with other clock sources or by itself, as described above. Furthermore, internal oscillator 216 can be designed with sufficient accuracy for a variety of applications. For example, the frequency of internal oscillator 216 can be designed to be sufficiently accurate (e.g., to less than ±2 percent of a specified frequency) over a relatively large supply voltage range (e.g., a voltage range of 1.9 volts to 6.5 volts). The clock frequency of internal oscillator 216 can be designed to be 1 MHz, 2 MHz, 4 MHz, or some other frequencies. The clock frequency of internal oscillator 216 can also be designed to be selectable from a set of frequencies.

Crystal Oscillator

Figure 3A:
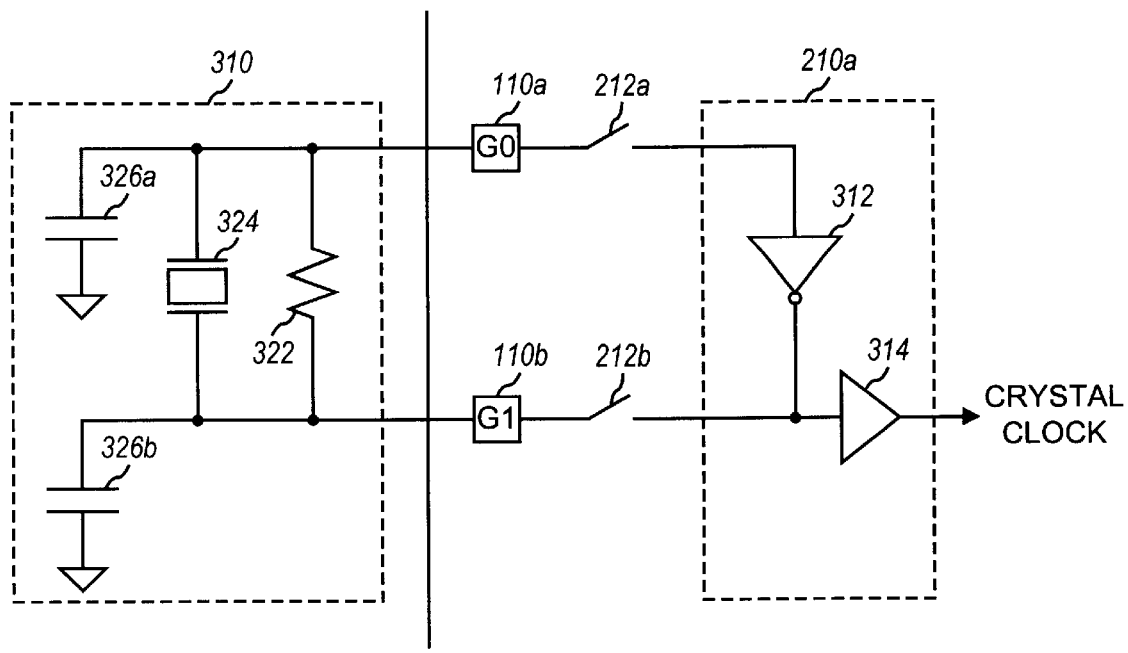
FIG. 3A is a schematic diagram of an embodiment of a crystal oscillator.

FIG. 3A is a schematic diagram of one embodiment of a crystal oscillator. The crystal oscillator includes a crystal clock circuit 210a coupled to an external tank circuit 310. Crystal clock circuit 210a is one implementation of crystal clock circuit 210 shown in FIG. 2. Within crystal clock circuit 210a, an inverting amplifier (or inverter) 312 provides the necessary signal amplification. Amplifier 312 couples, through switches 212a and 212b and further through pins 110a and 110b, to tank circuit 310. A buffer 314 couples to the output of amplifier 312 and provides the crystal clock signal.

Within tank circuit 310, resistor 322 and crystal 324 couple in parallel. Each end of crystal 324 further couples to a corresponding capacitor 326. Crystal 324 and capacitors 326 provide the necessary phase shift to enable oscillation. Crystal 324 is a high Q circuit that provides a predetermined phase shift at a precise specified frequency. Resistor 322 provides biasing of amplifier 312 and helps start up the oscillator. Resistor 322 typically has a large resistance value such as, for example, one mega-ohm (MΩ).

Amplifier 312 provides approximately 180 degrees of phase shift and the necessary signal gain. The remaining phase shift (of approximately 180 degrees) is provided by tank circuit 310, or more specifically, by crystal 324 and capacitors 326. As shown in FIG. 3A, crystal 324 operates in parallel mode. The operating mode, the effective load capacitance of capacitors 326, and the center frequency are specified parameters for crystal 324.

RC Oscillator

Figure 3B:
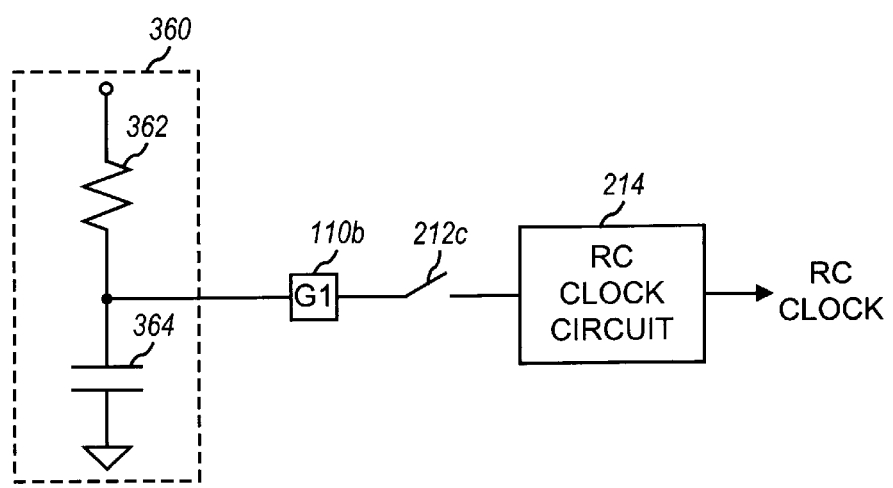
FIG. 3B is a schematic diagram showing the external components needed to support a RC oscillator.

FIG. 3B is a schematic diagram showing the external components needed to support the RC oscillator. RC clock circuit 214 couples, through switch 212b and pin 110b, to an external tank circuit 360. RC clock circuit 214 provides part of the necessary signal amplification. Tank circuit 360 includes passive elements that provide the necessary phase shift. As shown in FIG. 3B, tank circuit 360 includes a resistor 362 that couples in series with a capacitor 364. One end of resistor 362 couples to a supply source (V) and the other end couples to pin 110b. The frequency of oscillation can be controlled by selecting a proper combination of resistance and capacitance values for resistor 362 and capacitor 364, respectively. The RC oscillator is not described in detail herein since its design is well known in the art.

Internal Oscillator

Figure 4A:
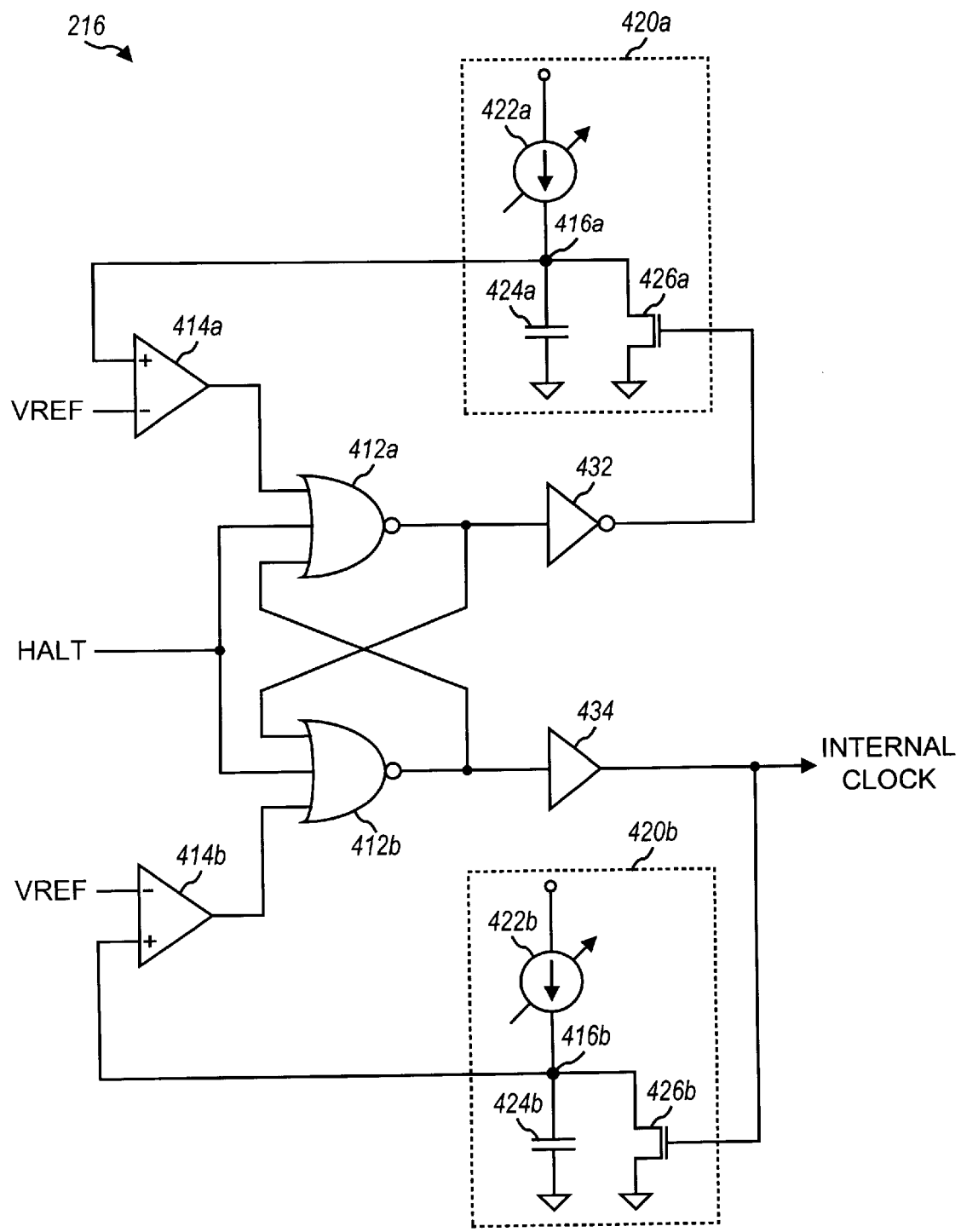
FIGS. 4A, 4B, and 4C are schematic diagrams of an embodiment of an internal oscillator, a programmable current source, and a fixed current source, respectively.

FIG. 4A is a schematic diagram of an exemplary embodiment of internal oscillator 216. Oscillator 216 includes a pair of three-input NOR gates 412a and 412b cross-coupled so that one of the three inputs of each NOR gate 412 is coupled to the output of the other NOR gate. The second inputs of NOR gates 412 couple to a control signal (HALT) used to enable and disable oscillator 216 (a logic high on the HALT control signal disables oscillator 216). The third inputs of NOR gates 412a and 412b couple to the outputs of respective amplifiers 414a and 414b. The inverting inputs of amplifiers 414 couple to a reference voltage (VREF). The non-inverting inputs of amplifiers 414a and 414b couple to nodes 416a and 416b of programmable current-capacitor (I-C) circuits 420a and 420b, respectively.

Within programmable I-C circuit 420, a programmable current source 422 couples in series with a capacitor 424. An N-channel transistor 426 couples in parallel with capacitor 424. The control input of transistors 426a and 426b couple to the outputs of an inverter 432 and a buffer 434, respectively. The inputs of inverter 432 and buffer 434 couple together and to the output of NOR gate 412a. As shown in FIG. 4A, the internal clock signal from oscillator 216 is derived from the output of buffer 434.

Oscillator 216 operates in the following manner. Assume initially that the three inputs of NOR gate 412a are at logic low or have just transitioned to logic low, thereby causing the output to transition to logic high. This logic high output causes the output of inverter 432 to transition to logic low and the output of buffer 434 to transition to logic high.

The logic high at the input of transistor 426b turns on the transistor. Capacitor 424b then quickly discharges through transistor 426b and the voltage at node 416b decreases. When the voltage at node 416b drops below that of the reference voltage (VREF), the output of amplifier 414b transitions to logic low. The output of NOR gate 412b remains at logic low since one of its input (the one that couples to the output of NOR gate 412a) is still at logic high.

The logic low at the input of transistor 426a turns off the transistor. Programmable current source 422a then charges capacitor 424a and the voltage at node 416a increases. When the voltage at node 416a exceeds the reference voltage (VREF), the output of amplifier 414a transitions to logic high. This logic high output causes the output of NOR gate 412a to transition to logic low, which then causes the output of NOR gate 412b to transition to logic high. Oscillator 216 is now in an opposite state from its initial state.

Generally, the discharge time of capacitor 424 is faster than its charge time. When enabled, N-channel transistor 426 can sink a (relatively) large amount of current from capacitor 424 and programmable current source 422. Thus, upon a transition in logic level at the output of NOR gate 412a, one of capacitors 424a and 424b is quickly discharged, and the other capacitor is charged (but not as quickly). Thus, the charge time of the capacitor determines the duration of a logic state.

Therefore, each programmable I-C circuit 420 controls one phase of the internal clock signal. For example, programmable I-C circuit 420a controls the duration of the logic low of the internal clock signal and programmable I-C circuit 420b controls the duration of the logic high. The duration of a logic state (e.g., logic low and logic high) depends on the rate at which capacitor 424 charges up. The rate of charging, in turn, depends on the capacitance of capacitor 424 and the amount of charging current from programmable current source 422. With higher charging current or smaller capacitance, capacitor 424 charges up more quickly, resulting in a shorter clock cycle and higher clock frequency. By accurately controlling the capacitance of capacitors 424a and 424b and the amount of charging current provided by programmable current sources 422a and 422b, accurate frequency control of the internal clock signal can be obtained.

An accurate and stable reference voltage (VREF) increases the accuracy and stability of the internal clock frequency, since this reference voltage determines the switching points of amplifiers 414a and 414b. The switching point is one factor that affects the duty cycle and frequency of the internal clock signal. In one embodiment, the reference voltage (VREF) is generated from, or related to, a band-gap reference source. The design of the band-gap reference source is well known in the art and not described herein. A band-gap reference voltage is generally accurate and stable over temperature, power supply, and manufacturing process variations.

Figure 4B:
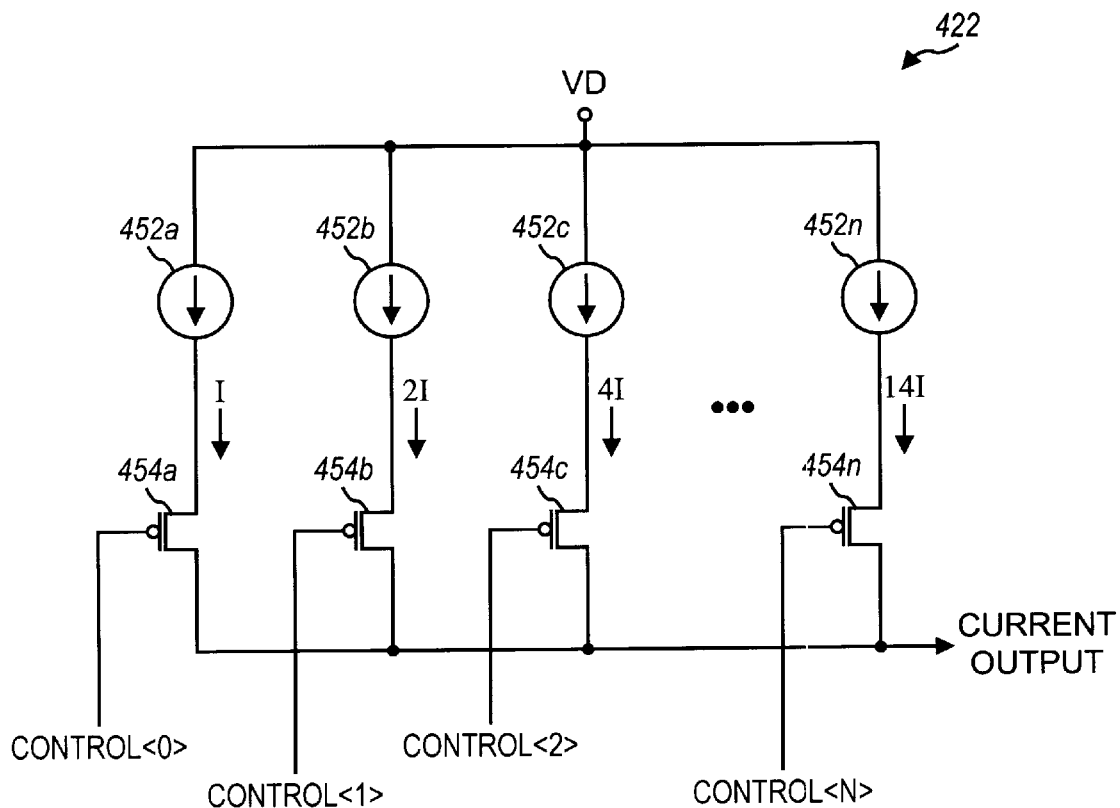

FIG. 4B is a schematic diagram of an exemplary embodiment of programmable current source 422. Programmable current source 422 includes a number of fixed current sources 452a through 452n coupled together at one end and to a supply voltage (VD). In the embodiment shown in FIG. 4B, each fixed current source 452 couples in series with an associated P-channel transistor 454. The drains of P-channel transistors 454 couple together to form the output of programmable current source 422. The number of fixed current sources 452 affects the range and resolution of programmability, with greater number of fixed current sources 452 generally corresponding to a higher degree of programmability. The invention can operate with just one fixed current source 452. However, more fixed current sources 452 are generally used to provide programming flexibility. In one specific embodiment, eight fixed current sources 452 are provided.

In one embodiment, each of fixed current sources 452 is designed to provide a different amount of current. For example, as shown in FIG. 4B, fixed current source 452a, 452b, 452c, through 452n are designed to provide I, 2I, 4I, through 14I amounts of current, respectively. In another embodiment, each fixed current source 452 is designed to provide the same amount of current. Other design variations can be implemented and are within the scope of the invention.

Programmable current source 422 allows programmability of the clock frequency of the internal oscillator. Calibration and setting of the internal clock frequency can be made at the manufacturing stage, or even during operation of integrated circuit 100. For example, the internal clock frequency can be measured during circuit testing of integrated circuit 100 and programmable current source 422 can be appropriately set to provide a specified clock frequency. The current setting is then stored as part of the control data in control register 230. In one embodiment, once the desired frequency is achieved, the final current setting data is permanently stored in a non-volatile register inside control register 230. Upon power up, the contents of the non-volatile register are automatically written to a volatile memory section of control register 230 to establish the desired frequency. A preferred embodiment for the power up reset mechanism is described in greater detail in commonly-assigned patent application Ser. No. 09/336,917 by Hanjani, which is hereby incorporated by reference for all purposes. The stored current setting is used to properly set and maintain the frequency of the internal oscillator. The calibration and setting of the internal clock frequency can also be made dynamically (i.e., periodically or as needed) so that the internal clock frequency can be maintained at desired frequency accuracy. Dynamic calibration and setting can be achieved in conjunction with an external clock signal.

With programmable current source 422, internal oscillator 216 can be designed with sufficient accuracy for numerous applications. For example, the frequency of internal oscillator 216 can be designed to be accurate to less than ±2 percent of a specified frequency over a relatively large supply voltage range.

Figure 4C:
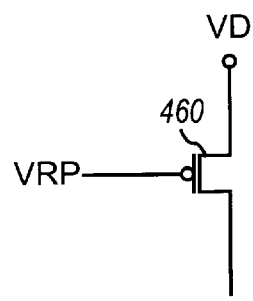

FIG. 4C shows one embodiment of fixed current source 452 implemented with a P-channel transistor 460. The source of P-channel transistor 460 couples to the supply voltage (VD) and the gate couples to a reference voltage (VRP). The amount of current conducted through P-channel transistor 460 can be controlled by proper sizing of the transistor. This device mirrors the fixed current of a current source. To reduce current variation of P-channel transistor 460 due to temperature, power supply, and manufacturing process variations, the voltages VD and VRP can be derived from, or related to, a band-gap reference source.

Conclusion

The foregoing description of the specific embodiments is provided to enable any person skilled in the art to make or use the invention. Various modifications to these embodiments will be readily apparent to those skilled in the art, and the principles defined herein may be applied to other embodiments without the use of the inventive faculty. For example, various other combinations of clock sources can be used than that shown in FIG. 2. Thus, the invention is not intended to be limited to the embodiments shown herein but is to be accorded the widest scope consistent with the principles and novel features disclosed herein, and as defined by the following claims.

What is claimed is:

1. A programmable multi-scheme clocking circuit implemented within an integrated circuit, the clocking circuit comprising:
   a plurality of clock sources having predetermined characteristics, the plurality of clock sources comprise:
      an internal oscillator, the internal oscillator digitally programmable to provide a range of frequencies and configured further to halt operation upon receiving a halt signal;
      a crystal clock circuit;
      an RC clock circuit; and
      an external clock interface circuit to receive and buffer an external clock signal;
   a multiplexer coupled to the plurality of clock sources, the multiplexer receives a set of control signals and provides one of the clock signals from the clock sources as an output clock signal; and
   a control circuit operatively coupled to the plurality of clock sources and the multiplexer, the control circuit includes a control register having control data to selectively enable one of the plurality of clock sources and provides the multiplexer with the set of control signals,
   wherein the control register comprises non-volatile memory ("NVM") to store and to provide the set of control signals generated by the control data in accordance to a user-defined mode.

2. A programmable multi-scheme clocking circuit of claim 1, wherein the control circuit includes a decoder circuit.

3. A programmable multi-scheme clocking circuit of claim 1, wherein the control register comprises EEPROM.

4. A programmable multi-scheme clocking circuit of claim 1, wherein the internal oscillator includes:
   at least two active device to provide signal gain;
   a latch to provide a transition edge of the internal oscillator output and electrically coupled to receive the halt signal configured to halt operation of the programmable I-C circuit; and at least two programmable I-C circuit coupled to the at least one active device.

5. A programmable multi-scheme clocking circuit of claim 4, wherein each programmable I-C circuit includes a programmable current source;

a capacitor operatively coupled to the programmable current source; and a switch coupled to the capacitor.

6. A clocking circuit comprising:

a crystal clock circuit clock source;

an RC clock circuit clock source;

an external clock interface circuit configured to receive and buffer an external clock signal from an external clock source;

an internal oscillator clock source having at least one active device to provide signal gain and configured to receive a halt signal to halt operation of the clock, and at least two programmable current-capacitor (I-C) circuit coupled to the at least one active device, wherein each I-C circuit includes a programmable current source, the programmable current source including at least one P-channel transistor having a source coupled to a voltage supply VD, and a gate coupled to a reference voltage VRP, wherein the voltage supply VD and the reference voltage VRP are related to a band-gap voltage reference, a capacitor operatively coupled to the programmable current source, and a switch coupled to the capacitor;

at least one switch interposed between an input of each of the clock sources and at least one device pin;

a multiplexer coupled to an output of each of the clock sources, the multiplexer receives a set of control signals and provides one of the clock signals from the clock sources as an output clock signal;

a decoder circuit operatively coupled to the plurality of clock sources and the multiplexer to selectively enable one of the plurality of clock sources and provides the multiplexer with the set of control signals; and a control register configured to receive and store control data, where the clock sources are selectively enabled in accordance with the control data provided to the multiplexer by the set of control signals, wherein the control register comprises EEPROM.

7. The clocking circuit of claim 6, the internal oscillator further comprises:

two cross-coupled logic gates, the logic gates electrically coupled to receive the halt signal configured to halt operation of the internal oscillator;

two programmable (I-C) circuits, each programmable I-C circuits is coupled to a respective one of the logic gates; and two amplifiers, each amplifier coupled to a respective one of the logic gates and further to a respective one of the programmable I-C circuits.

* * * * *